United States Patent [19]

Cummings

[11] Patent Number: 5,302,900
[45] Date of Patent: Apr. 12, 1994

[54] NMR SAMPLE SHAPER

[75] Inventor: Michael D. Cummings, Sunnyvale, Calif.

[73] Assignee: Varian Associates Inc., Palo Alto, Calif.

[21] Appl. No.: 996,352

[22] Filed: Dec. 23, 1992

Related U.S. Application Data

[63] Continuation of Ser. No. 811,443, Dec. 19, 1991, abandoned.

[51] Int. Cl.$^5$ ............................................. G01R 33/20
[52] U.S. Cl. ................... 324/321; 324/300; 324/318
[58] Field of Search ................. 324/321, 308, 305; 73/864.91; 422/102, 99; 138/84, 90; 137/800, 802

[56] References Cited

U.S. PATENT DOCUMENTS

| | | | |
|---|---|---|---|
| 3,091,732 | 5/1963 | Anderson et al. | 324/321 |
| 4,077,002 | 2/1978 | Erwine et al. | 324/321 |
| 4,254,373 | 3/1981 | Lippman et al. | 324/321 |
| 4,279,863 | 7/1981 | Friehler | 422/102 |
| 4,352,066 | 9/1982 | Kendrick et al. | 324/321 |
| 4,364,903 | 12/1982 | Bittings | 422/102 |
| 4,517,516 | 5/1985 | Hill et al. | 324/318 |
| 4,549,136 | 10/1985 | Zens | 324/308 |
| 4,824,560 | 4/1989 | Alspector | 422/102 |

FOREIGN PATENT DOCUMENTS

| | | | |
|---|---|---|---|
| 2137854 | 2/1973 | Fed. Rep. of Germany | 422/102 |
| 0061638 | 5/1981 | Japan | 324/321 |
| 0186594 | 12/1936 | Switzerland | 422/102 |
| 0636021 | 12/1978 | U.S.S.R. | 422/99 |

OTHER PUBLICATIONS

Chang et al., "A Convenient Nuclear Magnetic Resonance External Tubing", Applied Spectroscopy vol. 28, No. 2, 1974 p. 201 (no month).

Shoolery, J. N. "NMR Microcell Developments," *NMR/EPR Spectroscopy*, v. III, No. 3, 1962, pp. 8-9 (no month).

*Primary Examiner*—Michael J. Tokar
*Assistant Examiner*—Raymond Y. Mah
*Attorney, Agent, or Firm*—Gerald M. Fisher

[57] ABSTRACT

Improved NMR sample tube shapes and inserts for standard tubes to shape the sample for greater homogeneity to provide symmetry of liquid sample and tube to a greater distance from the observe region for the same volume of sample as used in the prior art.

5 Claims, 5 Drawing Sheets

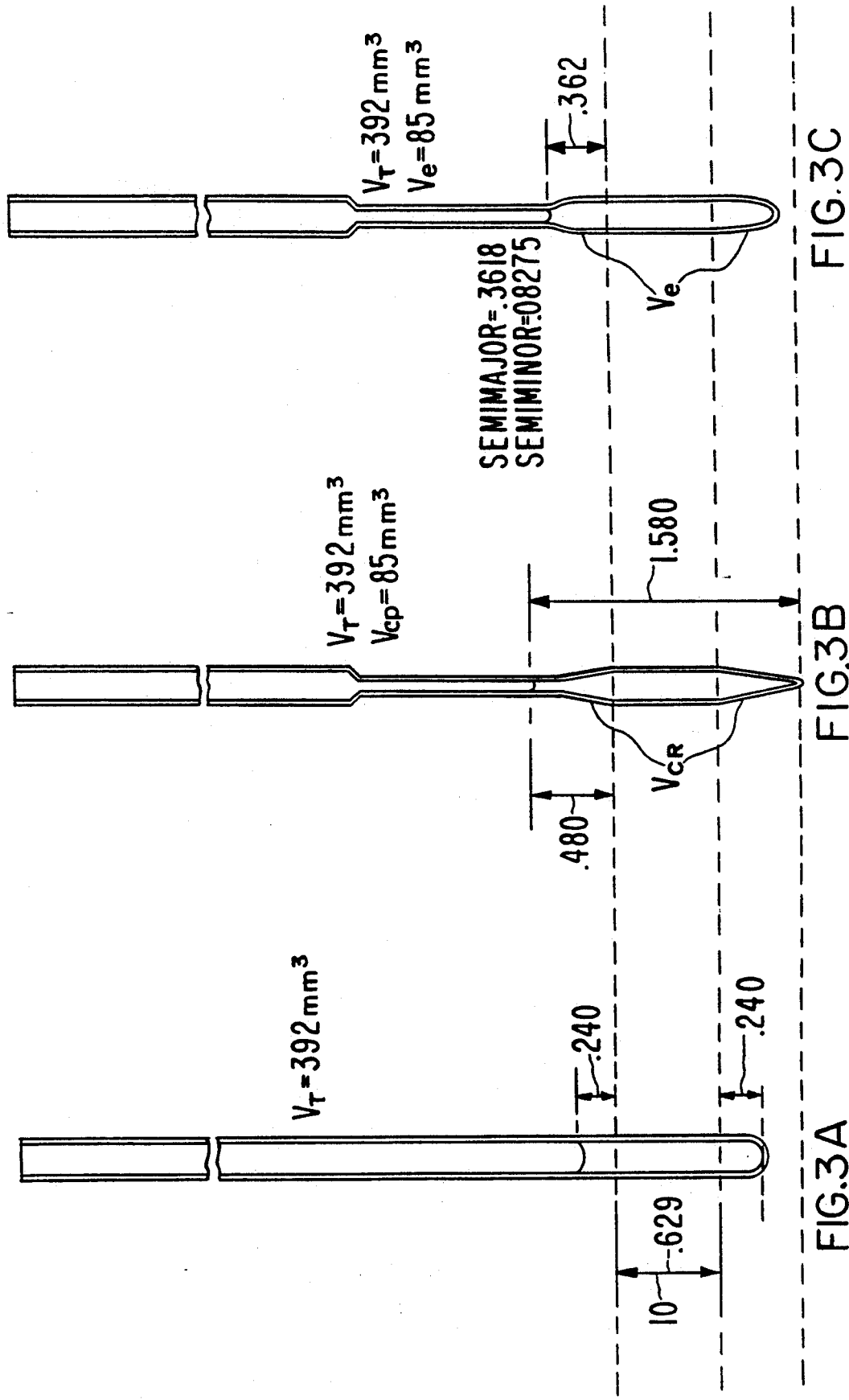

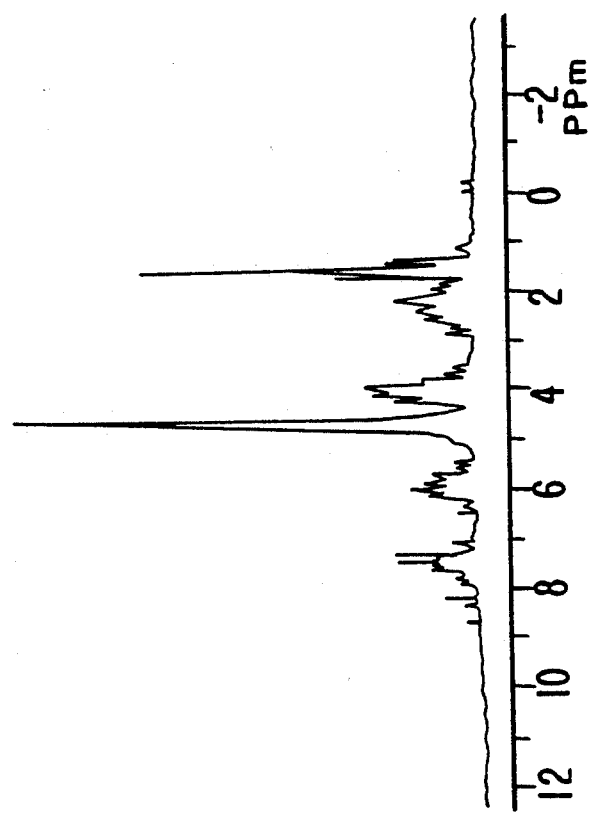
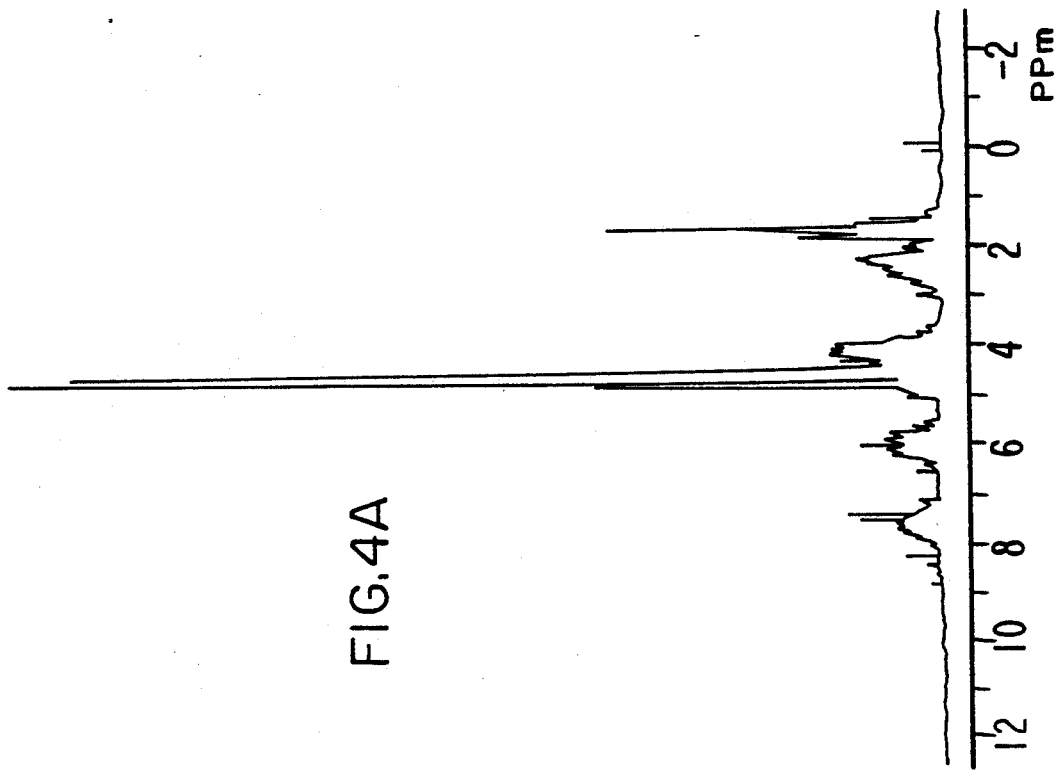

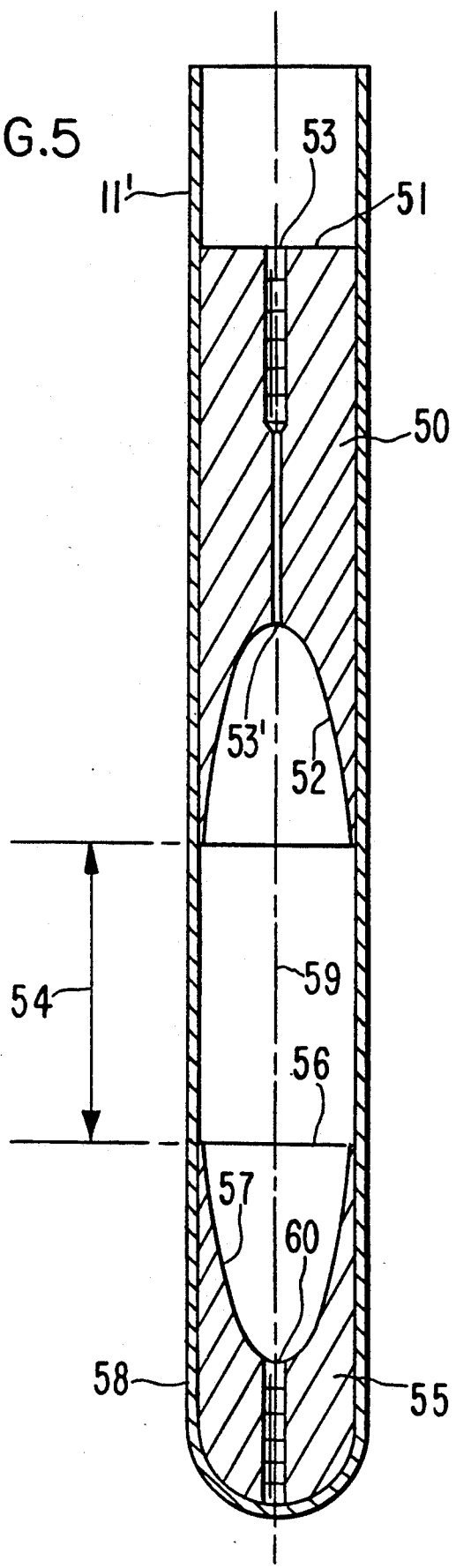

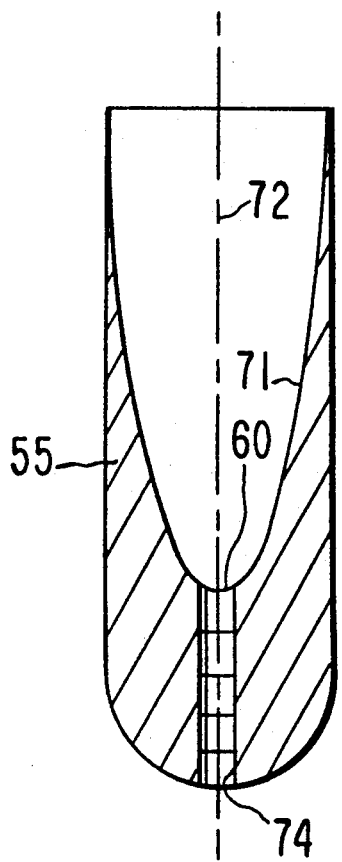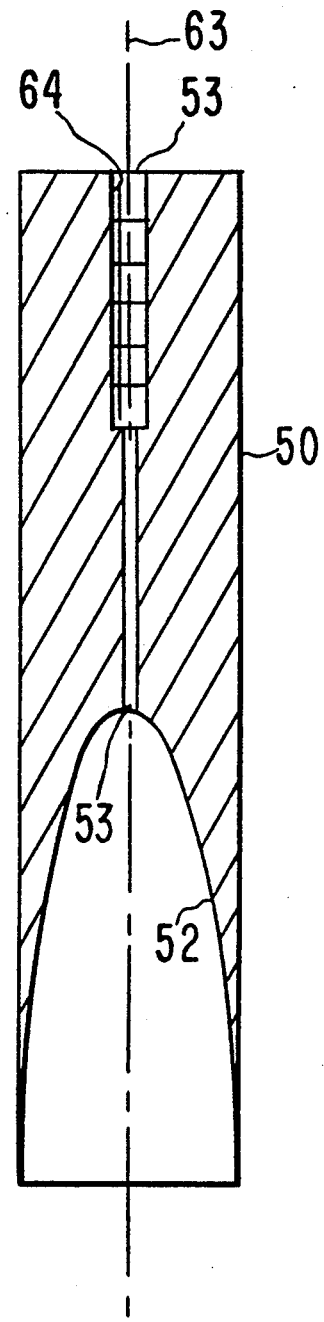

NMR SAMPLE SHAPER

The application is a continuation of application Ser. No. 07/811,443, filed Dec. 19, 1991, now abandoned.

FIELD OF THE INVENTION

This invention relates to NMR sample shaping by shaping sample tubes or inserts for tubes to improve magnetic field homogeneity across the regions of the sample tube which couple with the observe coil.

BACKGROUND OF THE INVENTION

Nuclear magnetic resonance spectroscopy (NMR) has been an important analytical technique since it became available in 1946. When atomic nuclei are placed in a constant, homogenous magnetic field of high intensity and subjected at the same time to a certain selected frequency RF alternating field, a transfer of energy can take place between the radio frequency field and the atomic nuclei to produce what is pictured as a flipping of the nuclei, which nuclei will immediately relax, i.e. flip back where they can reabsorb again resulting in a flipping back and forth. This flipping is called a resonance. More precisely, when a system of nuclei are exposed to radiation of frequency $f_o$, such that the energy $hf_o$ of a quantum of radiation, where h equals Plank's constant, is exactly equal to the energy difference between two adjacent nuclear energy levels, then energy transitions may occur in which the nuclei may be pictured as flipping back and forth from one allowed orientation to another. The apparatus for such NMR experiments is relatively simple in concept and comprises a large magnet to create a fixed field $H_o$ and electronic equipment to generate RF excitation energy (transmitter) which is coupled to an excitation coil which is positioned around and excites a sample and an electronic receiver which is also coupled to the coil in a part of the spectrometer known as the probe. In modern NMR spectrometer equipment the receiver and transmitter are ordinarily turned on and off very quickly so that the receiver is not receiving when the transmitter is on and vice versa.

It is important that the receiver coil be very closely coupled to the sample atoms which are normally dissolved in a solvent and placed in a sample test tube and that the receiver coil be filled as much as possible with sample material, i.e., have a large filing factor, because the intensity of the received signal in the receiver coil is related to the number of nuclei that couple to the coil and because the emitter signal from each nucleus is very small. A large proportion of the total NMR spectrometer improvement effort in recent years has been spent in improving the probe part of the NMR spectrometer instrument to improve the techniques for coupling to the sample.

Early in NMR development it was appreciated that a most important parameter in NMR was the homogeneity of the DC magnetic field, $H_o$. In fact when the homogeneity was first improved from the earliest magnets, the ability of the NMR spectrometer to perform high resolution spectroscopy was discovered. High resolution spectra are those spectra where the resonance lines are narrower than the major resonance shifts caused by differences in the chemical environment of the observed nuclei, such as are caused by secondary magnetic fields of the molecules of a sample. Homogeneity is a quality of the DC magnetic field. The goal is to have perfect homogeneity, meaning that all atoms of the sample are influenced by a magnetic field having identical direction and magnitude.

It has been heretofore appreciated that elements of the probe can also influence the homogeneity of the DC field lines across the sample. Since the probe contains different materials and shapes, each material and its shape influences the magnetic field differently and can accordingly affect the homogeneity deleteriously.

A prior patent by Anderson et al., U.S. Pat. No. 3,091,732 sought to make the probe coils and adhesives therefore from materials in which the mixed magnetic susceptibility matched that of the air surrounding the sample tube. Other inhomogeneity correction probe patents include U.S. Pat. No. 4,517,516 to correct for holes in a coil form, and U.S. Pat. No. 4,077,002 was directed to correcting for edge effects when an insufficient amount of the sample liquid itself was available to completely fill the observation area and well beyond. U.S. Pat. No. 4,549,136 teaches use of plugs of materials to be added to the sample tube whose susceptibility is equal to the sample tube solvent.

It has been standard for several years to employ long small diameter cylindrical sample tubes to conserve sample. When only very small sample volume is available, or the sample is very expensive even this approach is problematical and requires dilution of sample, with concomitant reduction in signal. In such cases sample plugs have been used in order to avoid end effects when the sample does not fill the sample space and beyond a satisfactory amount.

It was also known in the prior art to introduce a nylon plug into a sample tube which provided a spherical volume sample space. Also known were spherical glass bulbs. Spherical volumes have poor filling factor and suffered from imperfections in the glass of the sphere as well as perturbations introduced by the sample in the glass stem attached to the glass bulb.

It is an object of the present invention to enable improved magnetic field homogeneity and improve filing factor in an NMR sample probe by providing an improved shape of a sample with a reduced volume of sample.

It is a feature of the current invention that the diameter of the sample tube outside of the observe region decreases in diameter pursuant to a shape defined as a solid of revolution.

It is a further feature that the region of symmetrical shape of said sample tube on both sides of the observe region extend substantially further from said observe region for the same volume of sample liquid as in the prior art sample tubes.

It is a still further feature that appropriately configured plug inserts can be inserted into standard sample tubes to achieve the desired shape of the sample.

DESCRIPTION OF DRAWING

FIG. 3A, FIG. 3B and FIG. 3C are a cross section of a prior art small bore sample tube and a conical and ellipsoidal end shape embodiment respectively of the instant invention.

FIG. 4A and FIG. 4B are NMR spectra obtained from a sample of DNA protein fragment in H₂O contained in a prior art tube and in a sample tube containing inserts according to our invention respectively.

FIG. 5 is a cross section of a standard sample tube with an insert above and below the sample for shaping the end regions.

FIG. 6 is a cross sectional view of the top insert of this invention of FIG. 5.

FIG. 7 is a cross sectional view of the bottom insert of FIG. 5.

DETAILED DESCRIPTION

Figure 1:
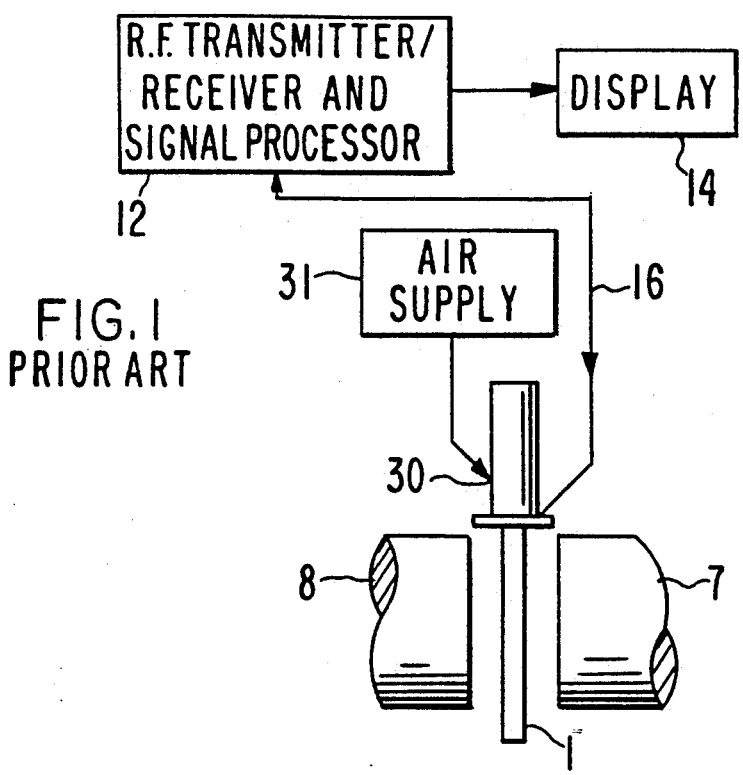
FIG. 1 is a block diagram and schematic of the prior art NMR sample probe and system.

With reference to FIG. 1, the block diagram of the essential features of an NMR spectrometer are apparent. The magnet with poles 7 and 8 for providing a homogenous magnetic field $H_o$, across a space into which a probe structure 1 comprised of a receiver/transmitter saddle coil 2, FIG. 2A, on both sides of a sample tube 11 for exciting the nuclei of the sample in sample tube which is suspended in the probe 1 and positioned so that the sample is centered in the region 10, FIG. 2 and FIG. 3, known as the observe interaction region.

The transmitter receiver and signal processor 12 is connected to the probe wires 16. Display 14 is coupled to the electronics module 12 and frequently includes recorders, printers and other forms of display apparatus. A spinner 30 is powered by air supply 31 for smearing out magnetic field inhomogeneity effects.

Figure 2A:
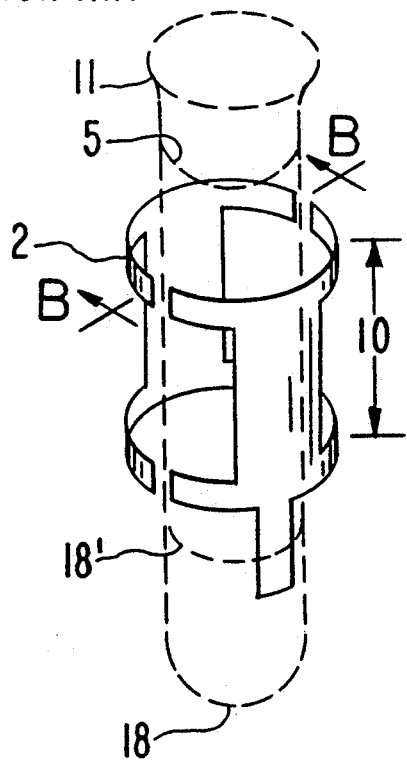
FIG. 2A is a three dimensional view of a saddle transmit/receive coil.

In the prior art, the meniscus 5, FIG. 2A formed by the spinning liquid in the sample tube caused end effect inhomogeneity. It is apparent that in the instance where the amount of sample is of limited availability, the sample tube would be raised from position 18 to position 18' so that the observe area 10 can be filled with sample while using the smallest amount of liquid in the tube. It is also apparent that in this position the materials near the bottom of the observe region will affect the homogeneity by abruptly introducing susceptibility changes caused by changes from air to glass to sample material.

It is also apparent that the shapes and materials are not symmetrical on the top and bottom of the observe region. On the top, near 5 the glass cylinder is open and continues without liquid while the glass cylinder is abruptly closed and stopped on the bottom.

To minimize these perturbances, when possible, the spectroscopist will overfill the sample tube to move the susceptibility interfaces away from the observe region. This practice requires 2-3 times as much sample and can also introduce artifacts by the stimulation of sample by stray RF fields.

Figure 2B:
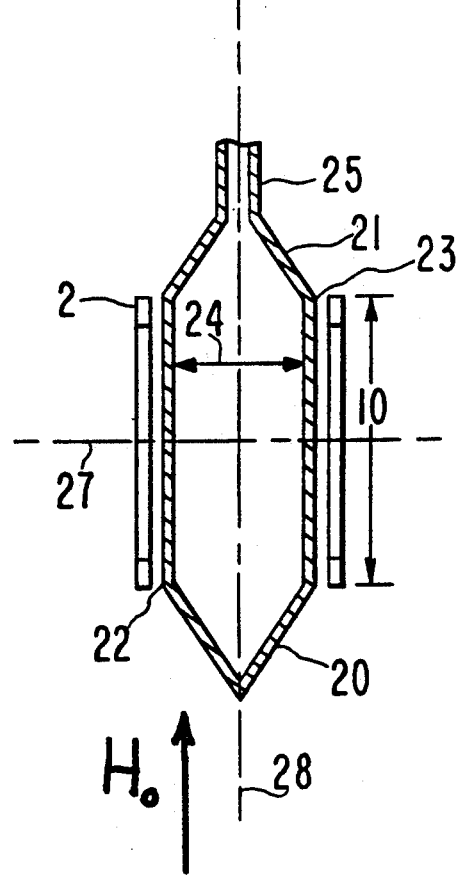
FIG. 2B is a cross section of a preferred embodiment of the sample tube of this invention and the saddle coil.

FIG. 2B shows an embodiment of a section of a sample tube according to the invention. Here the sample tube is shaped to completely contain the sample in a volume which is symmetric about the z axis 28 and substantially symmetrical about the mid plane 27. The abrupt ends of the liquid column which present susceptibility discontinuities in the prior art are shaped by the sample tube to minimize the discontinuities. The ends are shaped as a gradual solid of revolution, i.e., conically. This structure extends the ends of the sample fluid along the centerline much farther from the observe interaction region for the same total sample volume than in the prior art. The gradual change in shape of the tube of my invention reduces higher order gradients. In the observe interaction region, the diameter 24 of the sample tube is made as wide as possible to get a maximum filing factor. At appropriately selected positions 22 and 23 outside the interaction region 10, the sample tube is caused to change from a cylindrical shape to a conical shape. The top of the cone section at 21 does not completely close but instead terminates in a very small bore tube 25 for inserting the sample.

FIG. 3A shows the dimensions for a standard available Wilmad 528 sample tube. This shows that 392 mm³ of sample will extend only 0.240 inches beyond the observe region in a Varian NMR probe when the closed end of the tube is 0.240 inches from the bottom of the observe region. The observe interaction region is designated as 0.629 inches for this probe.

FIG. 3B shows that the conical end design, for the sample volume of 392 mm³, extends 0.480 on both sides of the interaction region without any sacrifice in the filing factor. The volume of each of the conical regions, $V_{cr}=5$ mm³. With reference to FIG. 3C, similar benefits can be obtained by shaping the tube end in an elliptical shape having semi major axis 0.3618 inches and semi minor axis 0.08275 inches. The volume of each of the elliptically shaped end $V_e=85$ mm³ and the fluid extends 0.362 inches on both sides of the observe region in this embodiment. This ellipsoidal configuration has the additional advantage that it will not distort a uniform magnetic field and that the field in an elliptical cavity is uniform if the surrounding field is uniform.

The objectives desired are accomplished by providing a shape for the ends of the sample tube which is formed as a solid of revolution such that $V = \pi \int y^2 dz$ where $y=f(z)$ and $z$ is the distance along said axis measured from said observe interaction region and $y$ is the distance from the axis to the surface of shaped tube end portion as a function of $z$ and where $y$ is selected so that preferably when $$y = f(z) = 0 \text{ then } |z| \geq \frac{D}{2}$$

where D is the diameter of the sample tube in the observe region.

When the end portion of the tube is shaped spherically, a minimum amount of sample volume would be required but the susceptibility discontinuity would occur closer to the edge of the observe region than for any of the other solid of revolution shapes. If a sufficient amount of sample exists, better results will be obtained with one of the end shapes which extends the region of most susceptibility discontinuity to a significant distance from the observe region.

I also have determined that it is possible to achieve the objectives of this invention without forming an entirely new sample tube from glass as described in respect to the embodiments of FIG. 3B and FIG. 3C. Specifically, with reference to FIG. 5, I have shaped a teflon top sample shaping insert 50 and teflon bottom sample shaping insert 55 to achieve the objectives of maintaining a high filling factor and reducing homogeneity field gradients near the sample ends. By forming the inner surface 52 and 57 as a surface of revolution about the Z axis 59, the above benefits are obtained.

In operation, the bottom insert is first inserted into test tube 11'. Insert 55 preferably has a bore 60 at its apex. When inserted, bore 60 is snugly pressed against the bottom 58 of test tube 11'. Next, an amount of sample fluid is introduced into the sample tube which is sufficient to fill past the observe region 54. Finally, the top insert 50 is pressed into the test tube 11' and it is pushed down upon the sample fluid until sample exits from the bore 53 at the apex of insert 50. Note that the insert 50 is not moved into the interaction observe region 54. When insert 50 is in position, by tapping the test tube sides, any air bubble which may form in the region near aperture 53' should be released through the aperture. By tipping the test tube, if a bubble is present near the aperture 53', it will be seen to move down and further agitation should break the surface tension and release the bubble. The shape of the inner surface of both the upper and lower insert is preferably elliptical even though the ellipse does not extend the sample end 58 as far from the interaction region as does the cone. Teflon susceptibility closely matches the susceptibility of water and the ellipse has the additional advantage of not distorting the magnetic field in its interior. Inserts have an advantage over glass tubes with shaped ends in that they move the region of susceptibility discontinuity further away from the observe region than with the shaped glass tube configuration.

FIG. 6 is a side view of the top insert 50. The interior of the disk is hollow and is shaped as a body of revolution about axis 63 with a small aperture 53' at the apex of the curve 52. Bore 53 at the upper end of top insert 50 is threaded (64) to receive a tool for positioning the insert.

FIG. 7 is a side view of the bottom insert 55. The interior of the disk is hollow and the shape 71 of the sidewalls is shaped as a body of revolution about axis 72 with a small bore 60 at the apex of curve 71. Bore 60 is threaded (74) to receive a tool for positioning the insert.

FIG. 4A shows the spectra obtained of a DNA protein fragment in 90% $H_2O$ with the sample tube inserts of FIG. 6 and FIG. 7 and demonstrates the improved homogeneity obtained for the sample materials and conditions using the sample tube inserts of this invention.

The spectra of FIG. 4A was obtained from a 5 mm diameter sample tube using flat susceptibility end plugs.

The spectra of FIG. 4B was obtained with the FIG. 5 inventive inserts of elliptical shape. Both samples were of identical volumes and had identical value of presaturation field to reduce the central proton line (most dominant line) which is derived from the water. The lines near the main water line are clearly better resolved.

It is apparent that changes can be made in the above apparatus and still come within the intent and scope of this invention. The description and drawings are illustrative of two embodiments of this invention and are not intended to limit the construction of the claims hereto.

I claim:

1. In a sample tube designed to fit into an NMR probe for insertion into an $H_0$ field and to couple a sample to an interaction observe region with coil turns for exciting and receiving NMR radio frequency energy, said tube being a glass, thin walled elongated structure having a tube axis, an open end and a closed end, and a uniform circular cross section of a first diameter D throughout said interaction observe region, the improvement comprising:

said tube axis being co-axial with said $H_0$ field;

means to provide a first and second volume within said tube, said first volume being outside said interaction observe region and between said interaction region and said closed end and being adjacent to said closed end, said second volume of said tube being outside said interaction observe region and between said interaction region and said open end, the shape of said first and second volume of said tube being mathematically defined as bodies of revolution such that said volumes satisfy the equation, Volume=$\pi \int y^2 dz$ where the axis of revolution is said tube axis z, and where z is distance along said axis measured from said observe interaction region and where y is the perpendicular distance from said tube axis to the surface defining said volume and wherein y decreases as a function of distance from said interaction region and wherein the perpendicular distance from said tube axis to said tube surface of said first and second portions are substantially symmetrical functions of z such that y=f(-z)=f(+z).

2. The tube of claim 1 wherein y=f(z) is defined by equations for a straight line.

3. The tube of claim 1 where y=f(z) is defined by the equations for an ellipse.

4. The sample tube of claim 1 wherein said means to provide said first and said second volume within said tube being a bottom insert and a top insert respectively, said bottom insert being a cylindrical disk having a first hollow interior surface shaped as said body of revolution, said bottom insert having a passage completely therethrough coaxial with said z axis and a second surface, said second surface being shaped convexly to match the shape of said closed end of said sample tube; and wherein said top insert is a second disk having a second hollow interior surface, said hollow interior surface being shaped as said body of revolution.

5. The sample tube of claim 4 wherein the y=f(z) function is defined by the equation for an ellipse.

* * * * *